United States Patent [19]

Tsuchiya et al.

[11] Patent Number: 4,889,791
[45] Date of Patent: Dec. 26, 1989

[54] POSITIVE TYPE PHOTORESIST MATERIAL

[75] Inventors: Shozo Tsuchiya, Tokyo; Nobuo Aoki; Shinichiro Suzuki, both of Yokohama, all of Japan

[73] Assignee: Nippon Oil Co., Ltd., Tokyo, Japan

[21] Appl. No.: 304,790

[22] Filed: Jan. 31, 1989

[30] Foreign Application Priority Data

Feb. 6, 1988 [JP] Japan .................................. 63-24919

[51] Int. Cl.$^4$ .......................... G03C 5/16; G03C 1/495
[52] U.S. Cl. ..................................... 430/270; 430/921; 430/923; 525/353
[58] Field of Search ............... 430/270, 280, 636, 923, 430/921; 526/287, 293; 525/253

[56] References Cited

U.S. PATENT DOCUMENTS

| | | | |
|---|---|---|---|
| 3,892,570 | 7/1975 | Monaham ............................ | 430/281 |
| 4,439,517 | 3/1984 | Irving ................................... | 430/921 |
| 4,504,372 | 3/1985 | Kirchmaryr et al. ............... | 430/921 |
| 4,618,564 | 10/1986 | Demmer et al. .................... | 430/326 |

*Primary Examiner*—Paul R. Michl
*Assistant Examiner*—Thorl Chea

*Attorney, Agent, or Firm*—Majestic, Parsons Siebert & Hsue

[57] ABSTRACT

A positive type photoresist material comprises a polymer having structural units each represented by the following formula (I) of;

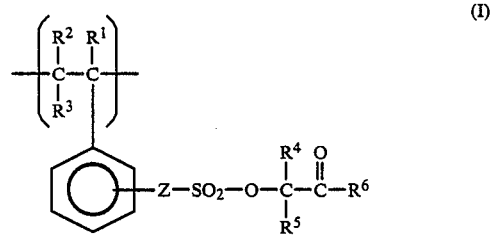

wherein each of $R^1$, $R^2$, $R^3$ and $R^6$ represents a hydrogen atom or a hydrocarbon residue having 1 to 12 carbon atoms, each or $R^4$ and $R^5$ represents a hydrogen atom, a hydroxyl group or a hydrocarbon residue having 1 to 12 carbon atoms and Z represents $-(CH_2)_n-$ which n indicates an integer of 0 to 4.

11 Claims, No Drawings

POSITIVE TYPE PHOTORESIST MATERIAL

BACKGROUND OF THE INVENTION

This invention relates to a positive type photoresist material.

A conventional positive type photoresist is composed of a mixture of an alkali-soluble novolak type phenol resin and naphthoquinone diazides. However, this type of photoresist is inconvenient in that, since the diazides are unstable to heat, even a portion thereof protected from chemical rays is decomposed when the temperature is raised to a more or less extent so that the quality of the formed image is lowered. This prior art photoresist is also inconvenient in that the diazides need be used at a higher mixing ratio in order that the diazides may act effectively as an inhibitor for inhibiting solubility in a water-soluble alkaline developing solution, and in that the novolak type base phenol resin exhibits considerable absorption of the ultraviolet part of the light rays such that the chemical rays used as the exposure light are not transmitted sufficiently to the bottom of the photoresist layer with the result that it becomes difficult to develop the boundary portion between the photoresist layer and the substrate.

It is known that, when a certain kind of sulfonates is irradiated with chemical rays, sulfonic acids are generated. When a composition containing such sulfonates is irradiated with chemical rays, solubility of the irradiated portion in the alkaline developing solution is increased. For this reason, it has been proposed in the Japanese Laid-open Patent Publication No. 260947/1985 to utilize the sulfonates as the photoresist. Although this prior-art photoresist is improved in thermal stability as compared with the photoresist containing the diazides, it is not entirely satisfactory in storage stability since it is a binary system mixture of the base resin and the photosensitive material, similarly to the conventional photoresist, while it is poor in resolution, which is one of the crucial properties of the photoresist, so that the photoresist cannot be used practically. With the use of a phenol resin as the base resin, transmittance of the photoresist to the ultraviolet part of the light rays is lowered. Similarly, with the use of an ethylenic resin as the base resin, the photoresist exhibits only poor plasma etching resistance.

SUMMARY OF THE INVENTION

It is a principal object of the present invention to provide a positive type photoresist material having high resolution and high transmittance to ultra violet rays and also exhibiting superior plasma etching resistance.

It is another object of the present invention to provide a positive type photoresist material exhibiting superior storage stability.

The above and other objects of the invention will become apparent from the following description.

According to the present invention, there is provided a positive type photoresist material comprising a polymer having structural units each represented by the following formula of;

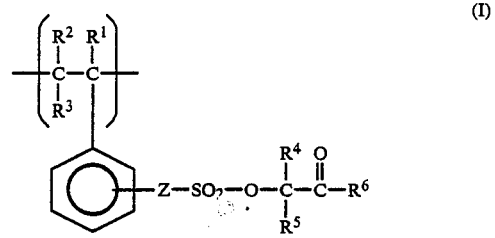

wherein each of $R^1$, $R^2$, $R^3$ and $R^6$ represents a hydrogen atom or a hydrocarbon residue having 1 to 12 carbon atoms, each of $R^4$ and $R^5$ represents a hydrogen atom, a hydroxyl group or a hydrocarbon residue having 1 to 12 carbon atoms and Z represents $-(CH_2)_n-$ in which n indicates an integer of 0 to 4.

PREFERRED EMBODIMENTS OF THE INVENTION

The present invention will be explained in detail hereinbelow.

In the following formula (I)

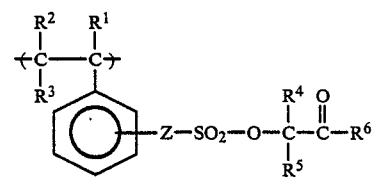

representing a positive type photoresist material of the present invention, each of $R^1$, $R^2$, $R^3$ and $R^6$ represents a hydrogen atom or a hydrocarbon residue having 1 to 12 carbon atoms, and each of $R^4$ and $R^5$ represents a hydrogen atom, a hydroxyl group or a hydrocarbon residue having 1 to 12 carbon atoms. Examples of C1 to C12 hydrocarbon residues represented by $R^1$ to $R^6$ preferably include an alkyl group, a cycloalkyl group, a phenyl group, an alkyl-substituted phenyl group, a naphthyl group or an alkyl-substituted naphthyl group. As regards $R^6$, a hydrogen atom or atoms of the hydrocarbon residue may be substituted by one or more hydroxyl groups, nitro groups, cyano groups or halogen atoms. $R^4$ and $R^5$ each represent a hydrogen atom, a hydroxyl group or a hydrocarbon residue having 1 to 12 carbon atoms. Z represents $-(CH_2)_n-$, where n is an integer of from 0 to 4 and preferably 0 to 2. According to the present invention, it is most preferred that $R^1$, $R^2$, $R^3$ and $R^4$ each represent a hydrogen atom, $R^5$ and $R^6$ each represent a methyl group, n=0 and Z be at the para position.

The polymer of the present invention may be produced usually by polymerizing the compound shown by the following formula (A):

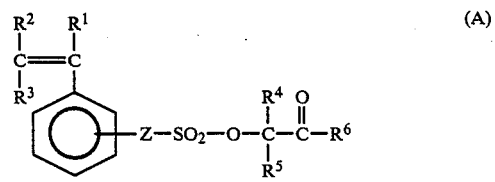

where $R^1$ to $R^6$ and Z have the same meanings as in the above formula (I). The compounds represented by the formula (A) may preferably be enumerated by

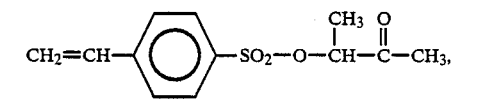

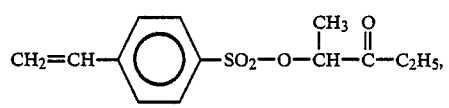

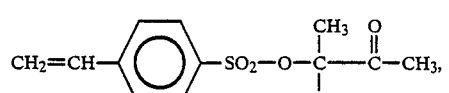

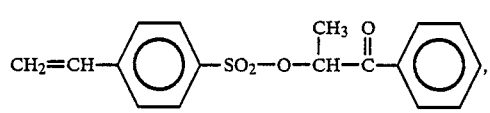

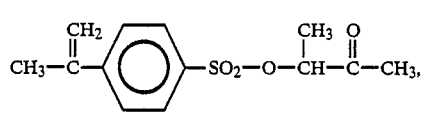

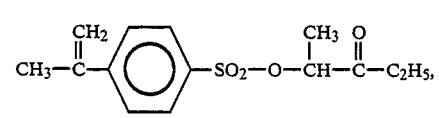

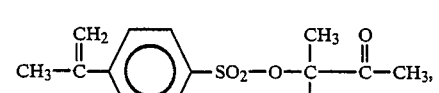

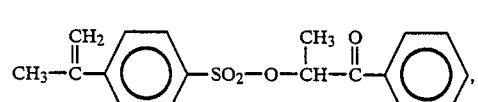

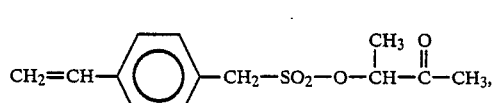

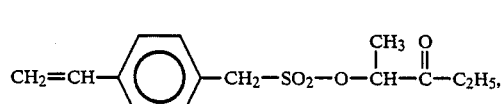

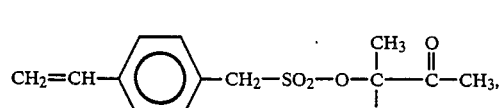

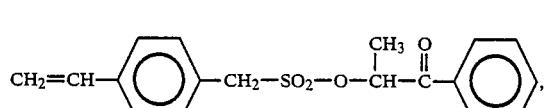

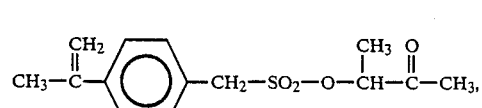

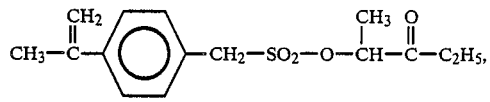

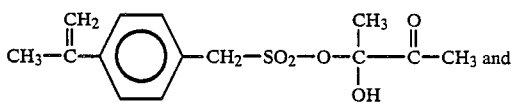

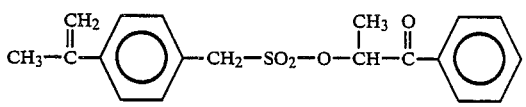

The compounds represented by the formula (A) may be produced by various methods. For example, the compound (B) represented by the following formula (B):

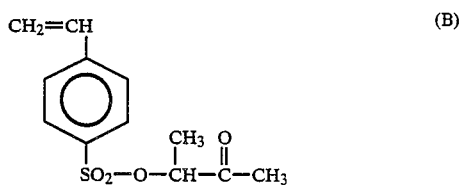

may be synthesized by the reaction of esterification of p-toluene sulfonyl chloride and acetoin.

According to the present invention, in polymerizing the compound of the formula (A) for producing the polymer having the structural units shown by the above formula (I), the polymerization reaction may be performed at a temperature of $-20°$ to $150°$ C. and preferably at a temperature of $20°$ to $100°$ C. in the presence of a catalyst using, for example, a radical polymerization initiator.

The radical polymerization initiators may preferably include for example organic peroxide type catalysts, such as t-butylhydroperoxide, cumenhydroperoxide, di-t-butyl peroxide, t-butylcumyl peroxide, diisopropyl peroxydicarbonate, or dicyclohexyl peroxydicarbonate, azo compound type catalysts, such as azobis isobutyronitrile or azobis-2,4-dimethylvaleronitrile, or redox type catalysts such as a benzoyl peroxide/dimethyl aniline system or a low valency metal (such as cobalt or copper) or salts thereof/alkyl halogenides (such as carbon tetrachloride or benzyl chloride) system.

As the solvents, organic solvents usually employed in radical polymerization may be employed, such as aromatic hydrocarbons, such as benzene and toluene, ketones such as methylethylketone or methylisobutylketone, ethers such as tetrahydrofuran, esters such as ethyl acetate, or chlorine base solvents, such as chloroform or carbon tetrachloride. Above all, benzene, methylisobutylketone and tetrahydrofuran are preferred.

The polymer of the present invention has the molecular weight in terms of the number average molecular weight of preferably 5,000 to 500,000 and more preferably 10,000 to 200,000. With the number average molecular weight less than 5,000, the resolution is lowered. On the other hand, with the number average molecular weight larger than 500,000, the solubility of the polymer in the solvent is undesirably lowered.

Also, in the polymer of the present invention, the polymer having the structural units represented by the formula (I) may additionally include, to the extent that the properties of the polymer of the present invention are not impaired, the structural units represented by the formula (II):

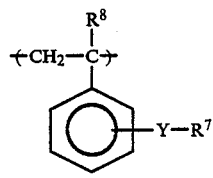
(II)

where $R^7$ represents a hydrogen atom, an alkyl group having 1 to 8 carbon atoms, $-SO_3R'$ or $-COOR''$, where $R'$ and $R''$ each represent an alkyl group having 1 to 4 carbon atoms, a cycloalkyl group, a phenyl group, a tolyl group, a xylyl group, a cumenyl group, a benzyl group, a phenetyl group or a naphthyl group. In the above formula, $R^8$ represents a hydrogen atom or a hydrocarbon residue having 1 to 8 carbon atoms and Y represents $-(CH_2)_m-$, where m represents an integer of 0 to 4 and preferably 0 to 2. Y is preferably at the para position.

According to the present invention, in order that the structural units represented by the formula (II) may be additionally contained in the polymer, usually the compound represented by the following formula (C)

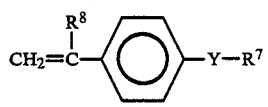
(C)

wherein $R^7$, $R^8$ and Y have the same meanings as in the formula (II) above, may be polymerized with the compound represented by the formula (A) using the above described polymerization methods. The compounds represented by the formula (C) may be enumerated for example by

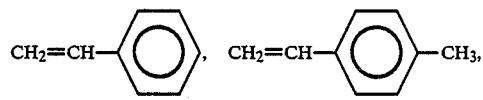

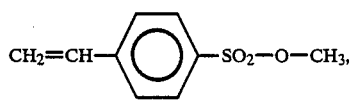

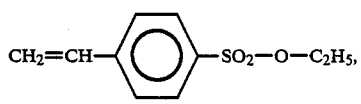

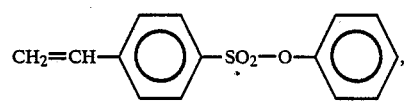

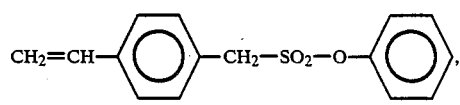

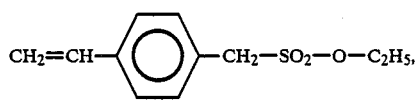

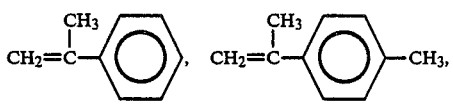

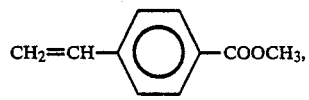

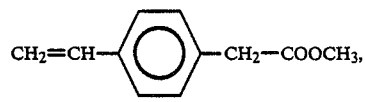

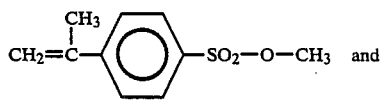

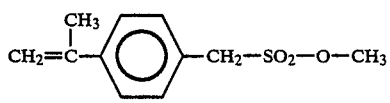

The contents in the polymer of the structural units shown by the formula (II) are preferably 0 to 50 mol % and more preferably 0 to 30 mol %. While an economic merit is derived by having the above structural units contained in the polymer, contents of more than 50 mol % are not preferred since the sensitivity and resolution are lowered to run counter to the objects of the present invention.

EXAMPLES OF THE INVENTION

The present invention will be explained with reference to Examples and Comparative Examples. It should be noted, however, that these Examples are given only for illustration and are not intended to limit the present invention.

a. Synthesis of Polymers

SYNTHESIS EXAMPLE 1

Equimolar amounts of p-styrene sulfonyl chloride and acetoin were subjected to esterification reaction at 0° C. for two hours in the presence of pyridine to produce a compound represented by the following formula (1):

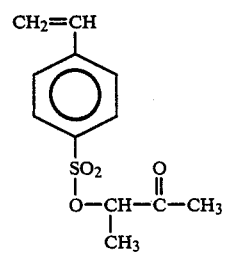
(1)

In an eggplant-shaped flask of 25 ml capacity, the atmosphere of which was replaced by nitrogen, 2 g of the compound (1) and 0.02 g of azobis isobutyronitrile were added to 5 ml of benzene, and the resulting mixture was polymerized under agitation at 80° C. for three hours. The product obtained after termination of the reaction was added dropwise to 200 ml of ether to produce fine precipitates. These precipitates were washed with ether and dried in vacuum at 30° C. for two hours to produce 1 g of brownish powders. An elementary analysis, IR analysis and NMR analysis revealed that these powders are the polymer of the compound (1). Using gel permeation chromatography, the molecular weight of the powders was measured and found to be equal to 24,000 in terms of the number average molecular weight based on polystyrene.

SYNTHESIS EXAMPLE 2

Equimolar amounts of vinylbenzyl sulfonyl chloride and acetoin were subjected to esterification reaction at 0° C. for two hours in the presence of pyridine to produce a compound represented by the following formula (2):

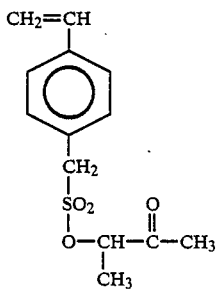

The reaction of polymerization was carried out in the same way as in Synthesis Example 1 to produce a polymer having a number average molecular weight of 24,000.

SYNTHESIS EXAMPLE 3

Equimolar amounts of p-styrene sulfonyl chloride and ethanol were subjected to esterification reaction at 0° C. for two hours in the presence of pyridine to produce a compound represented by the following formula (3):

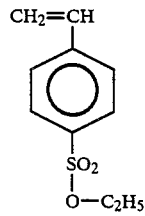

With the charging molar ratio of the compounds (1) to (3) of 8 to 2, the polymerization was carried out in the same way as in Synthesis Example 1 to produce a polymer having the number average molecular weight of 29,000. It was revealed by the elementary analysis and IR analysis that the molar ratio of the compounds (1) to (3) in the polymer was 72 to 28.

COMPARATIVE SYNTHESIS EXAMPLE 1

With the charging molar ratio of the compounds (1) to (3) of 5 to 5, the polymerization was carried out in the same way as in Synthesis Example 1 to produce a polymer having a number average molecular weight of 32,000. It was revealed by the analyses similar to those of the Synthesis Example 3 that the molar ratio of the compounds (1) to (3) was equal to 40 to 60.

b. Evaluation of Resolution

One of the measures indicating the resolution is the gamma value which is given by the inclination of a sensitivity characteristic curve at the point of intersection thereof with the horizontal axis. The larger this gamma value, the higher is the resolution of the photoresist material. The resolution was evaluated mainly on the basis of these gamma values.

EXAMPLE 1

A 15% solution in cyclohexanone of the polymer synthesized in Synthesis Example 1 was coated on a Si wafer using a spinner rotating at 3,000 rpm. The solution thus coated was pre-baked at 90° C. for two minutes to produce a coating 0.5 $\mu$m thick. Using a high pressure mercury lamp and an interference filter, only the 254 nm light was irradiated on the coating and a sensitivity characteristic curve was prepared to find the gamma value. Development and rinsing were performed in a 1% aqueous solution of NaOH at 20° C. for 60 seconds and in $H_2O$ at 20° C. for 60 seconds, respectively. The gamma value and the sensitivity were found to be equal to 9.1 and 300 mJ/cm$^2$, respectively.

EXAMPLE 2

Using a KrF excimer laser in place of the light source of Example 1, a sensitivity curve was prepared to find the gamma value. The gamma value of 9.0 was obtained. By using a similar method, contact exposure was carried out with the use of a mask of a test pattern. In this manner, the resolution of 0.5 $\mu$m was obtained.

EXAMPLE 3

A 15% solution in cyclohexanone of the polymer synthesized in Synthesis Example 2 was coated on a Si wafer using a spinner rotating at 3,000 rpm. The solution thus coated was pre-baked at 90° C. for two minutes to produce a coating 0.5 $\mu$m thick. Exposure to light was performed in the same way as in Example 1. Development and rinsing were performed in a 1.5% aqueous solution of 2% tetramethyl ammonium hydroxide at 20° C. for 60 seconds and in $H_2O$ at 20° C. for 60 seconds, respectively, to find the gamma value. The obtained gamma value was 7.3.

EXAMPLE 4

A 15% solution in cyclohexanone of the polymer synthesized in Synthesis Example 3 was coated on a Si wafer using a spinner rotating at 4,000 rpm. The solution thus coated was pre-baked at 90° C. for two minutes to produce a coating 0.5 $\mu$m thick. The gamma value was obtained in the same way as in Example 1. The obtained gamma value was 6.2.

COMPARATIVE EXAMPLE 1

20 parts of N,N-dimethylformamide, 4 parts of a cresol-novolak mixture having a softening point of 136° C. and 2 parts of benzoin-p-toluene sulfonate were mixed together to form a solution. This solution was coated on a Si wafer using a spinner rotating at 4,000 rpm. The solution thus obtained was pre-baked at 90° C. for two minutes to form a coating 0.5 $\mu$m thick. Exposure to light was effected in the same way as in Example 1. Development and rinsing were effected in a 2% NaOH aqueous solution at 20° C. for 90 seconds and in H$_2$O at 20° C. for 60 seconds, respectively, to find the gamma value. The gamma value obtained in this manner was 1.8. The sensitivity was found to be equal to 400 mJ/cm$^2$.

COMPARATIVE EXAMPLE 2

20 parts of N,N-dimethylformamide, 2 parts of an acryl polymer prepared from methyl methacrylate and methacrylic acid having a methyl methacrylate to methacrylic acid molar ratio of 75:25 and an acid value of 2.18 equivalents/kg and 1 part of benzoin-p-toluene sulfonate were mixed together to form a solution. This solution was coated on a Si wafer using a spinner rotating at 3800 rpm. The solution thus coated was pre-baked at 90° C. for two minutes to form a coating 0.5 μm thick. The gamma value was measured in the same way as in Example 1 and found to be equal to 1.5.

COMPARATIVE EXAMPLE 3

A 15% solution in cyclohexanone of the polymer synthesized in Comparative Synthesis Example 1 was coated on a Si wafer using a spinner rotating at 4,800 rpm. The solution thus coated was pre-baked at 90° C. for two minutes to produce a coating 0.5 μm thick. The gamma value was obtained in the same way as in Example 1. The obtained gamma value was 2.5.

c. Plasma Etching Resistance

Table 1 shows the results of evaluation of the CF$_4$ plasma etching resistance for Example 1 to Comparative Example 3. The CF$_4$ plasma etching resistance was indicated by the plasma etching speed, that is, the speed at which etching proceeded. The smaller the value of the plasma etching speed, the higher is the CF$_4$ plasma etching resistance. As the plasma generator, the Plasma Reactor PR 501A, manufactured by Yamato Kagaku KK, was employed. In Table 1, the CF$_4$ plasma etching resistance is shown as relative values, with the CF$_4$ plasma etching speed of a commercially available positive type photoresist material "OFPR-2", manufactured by Tokyo Oka Kogyo KK, being set to 100.

TABLE 1

|         | Gamma Value | Plasma Etching Speed |
|---------|-------------|----------------------|
| Ex. 1   | 9.1         | 97                   |
| 2       | 9.0         | 97                   |
| 3       | 7.3         | 98                   |
| 4       | 6.2         | 97                   |
| Comp. Ex. 1 | 1.8     | 105                  |
| 2       | 1.5         | 350                  |
| 3       | 2.5         | 103                  |
| OFPR - 2 | 2.4        | 100                  |

The positive type photoresist material according to the present invention has a high transmittance to ultraviolet rays and a high resolution, while being superior in plasma etching resistance and storage stability.

Although the present invention has been described with reference to the specific examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A positive type photoresist material comprising a polymer having structural units each represented by the following formula (I) of;

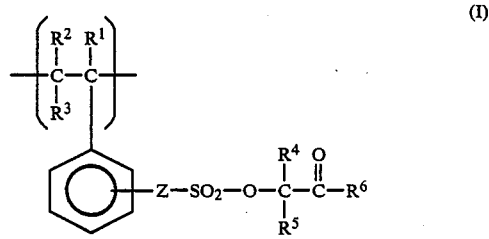

(I)

wherein each of $R^1$, $R^2$, $R^3$ and $R^6$ represents a hydrogen atom or a hydrocarbon residue having 1 to 12 carbon atoms, each of $R^4$ and $R^5$ represents a hydrogen atom, a hydroxyl group or a hydrocarbon residue having 1 to 12 carbon atoms and Z represents $-(CH_2)_n-$ in which n indicates an integer of 0 to 4.

2. The positive type photoresist material according to claim 1 wherein the C1 to C12 hydrocarbon residue represented by $R^1$ to $R^6$ in the formula (I) is selected from the group consisting of an alkyl group, a cycloalkyl group, a phenyl group, an alkyl-substituted phenyl group, a naphthyl group and an alkyl-substituted naphthyl group.

3. The positive type photoresist material according to claim 1 wherein at least one hydrogen atom of the hydrocarbon residue represented by $R^6$ in the formula (I) is substituted by a group or an atom selected from the group consisting of a hydroxyl group, a nitro group, a cyano group and a halogen atom.

4. The positive type photoresist material according to claim 1 wherein each of $R^1$, $R^2$, $R^3$ and $R^4$ is a hydrogen atom, each of $R^5$ and $R^6$ represents a methyl group and n=0 and wherein —Z— is bonded to the para position of a benzene ring.

5. The positive type photoresist material according to claim 1 wherein said polymer is obtained by polymerizing a monomer represented by the following formula (A) of;

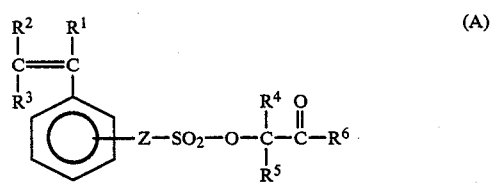

(A)

wherein each of $R^1$, $R^2$, $R^3$ and $R^6$ represents a hydrogen atom or a hydrocarbon residue having 1 to 12 carbon atoms, each of $R^4$ and $R^5$ represents a hydrogen atom, a hydroxyl group or a hydrocarbon residue having 1 to 12 carbon atoms and Z represents $-(CH_2)_n-$ in which n indicates an integer of 0 to 4.

6. The positive type photoresist material according to claim 5 wherein said monomer represented by the formula (A) is selected from the group consisting of

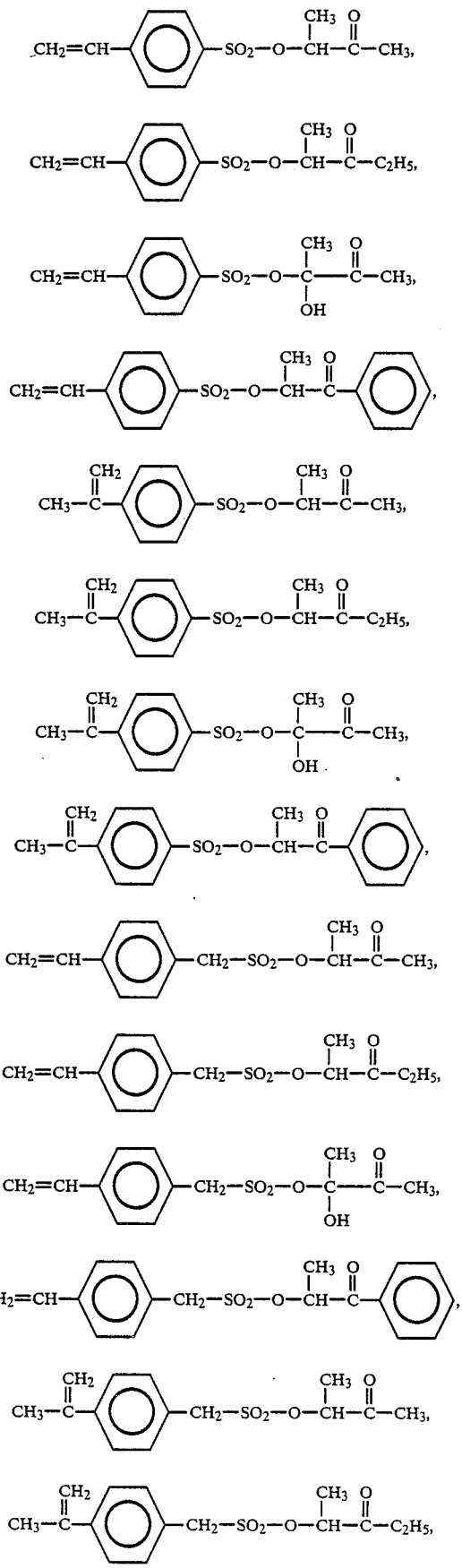

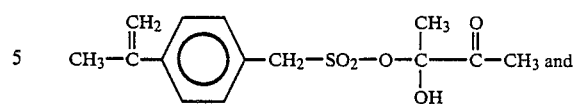

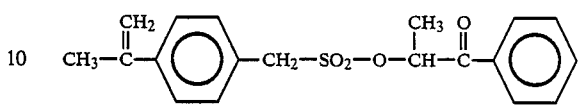

7. The positive type photoresist material according to claim 1 wherein said polymer has a number average molecular weight of 5,000 to 500,000.

8. The positive type photoresist material according to claim 1 wherein said polymer includes structural units represented by the following formula (II) of;

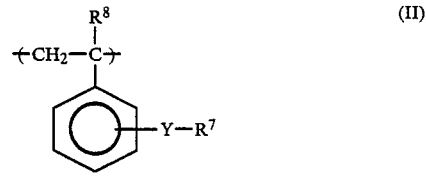

wherein $R^7$ represents a hydrogen atom, an alkyl group having 1 to 8 carbon atoms, —SO$_3$R' or —COOR", each of R' and R" indicating an alkyl group having 1 to 4 carbon atoms, a cycloalkyl group, a phenyl group, a tolyl group, a xylyl group, a cumenyl group, a benzyl group, a phenyl group, a phenetyl group or a naphthyl group, $R^8$ represents a hydrogen atom or a hydrocarbon residue having 1 to 8 carbon atoms and Y represents —(CH$_2$)$_{\overline{m}}$, m indicating an integer of 0 to 4.

9. The positive type photoresist material according to claim 8 wherein the structural units represented by the formula (II) are obtained by polymerizing a monomer represented by the formula (C) of;

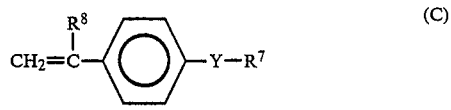

wherein $R^7$ represents a hydrogen atom, an alkyl group having 1 to 8 carbon atoms, —SO$_3$R', or —COOR", each of R' and R" indicating an alkyl group having 1 to 4 carbon atoms, a cycloalkyl group, a phenyl group, a tolyl group, a xylyl group, a cumenyl group, a benzyl group, a phenetyl group or a naphthyl group, $R^8$ represents a hydrogen atom or a hydrocarbon residue having 1 to 8 carbon atoms, and Y represents —(CH$_2$)$_{\overline{m}}$, m indicating an integer of 0 to 4.

10. The positive type photoresist material according to claim 9 wherein the monomer represented by the formula (C) is selected from the group consisting of

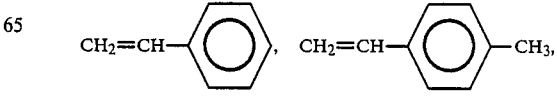

-continued
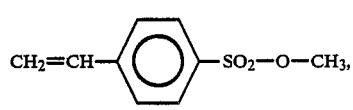
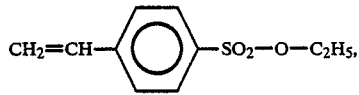
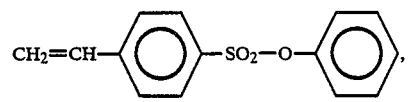
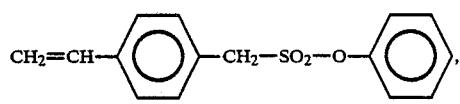
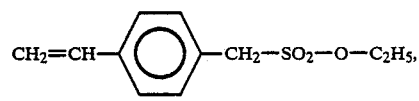
-continued
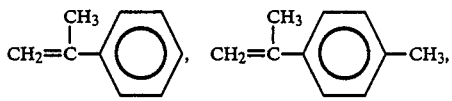
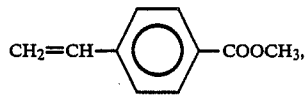
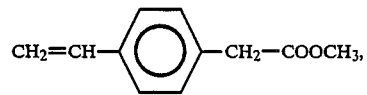
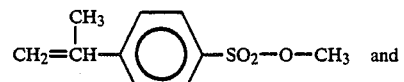 and
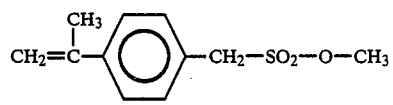
11. The positive type photoresist material according to claim 8 containing up to 50 mol. % of the structural units represented by the formula (II) in the polymer.
* * * * *